United States Patent
Wu et al.

(10) Patent No.: US 7,892,895 B2
(45) Date of Patent: Feb. 22, 2011

(54) DIODE JUNCTION POLY FUSE

(75) Inventors: Shien-Yang Wu, Hsin-Chu (TW); Shi-Bai Chen, Tai-Chung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/207,634

(22) Filed: Aug. 19, 2005

(65) Prior Publication Data

US 2005/0277232 A1  Dec. 15, 2005

Related U.S. Application Data

(62) Division of application No. 10/806,955, filed on Mar. 23, 2004, now Pat. No. 6,956,277.

(51) Int. Cl.
*H01L 21/82* (2006.01)

(52) U.S. Cl. .............................. 438/132; 257/E21.592

(58) Field of Classification Search ................ 438/132, 438/131, 215, 281, 333, 467, 601, FOR. 433; 257/209, 529, E23.149, E21.592
See application file for complete search history.

(56) References Cited

U.S. PATENT DOCUMENTS

| | | | | |
|---|---|---|---|---|
| 3,012,121 A | * | 12/1961 | Hicks | 337/160 |
| 5,331,195 A | * | 7/1994 | Yukihiro | 257/529 |
| 5,530,270 A | * | 6/1996 | Takahashi et al. | 257/154 |
| 5,708,291 A | * | 1/1998 | Bohr et al. | 257/529 |
| 6,242,790 B1 | * | 6/2001 | Tsui et al. | 257/529 |
| 6,323,535 B1 | | 11/2001 | Iyer et al. | |
| 6,356,496 B1 | * | 3/2002 | Carroll et al. | 365/225.7 |
| 6,580,156 B1 | * | 6/2003 | Ito et al. | 257/665 |
| 6,624,499 B2 | * | 9/2003 | Kothandaraman et al. | 257/529 |
| 7,106,164 B2 | * | 9/2006 | Voldman | 337/293 |
| 7,485,933 B2 | * | 2/2009 | Harada | 257/380 |
| 2006/0220263 A1 | * | 10/2006 | Waki et al. | 257/786 |

* cited by examiner

*Primary Examiner*—Matthew S Smith
*Assistant Examiner*—Quovaunda Jefferson
(74) *Attorney, Agent, or Firm*—Slater & Matsil, L.L.P.

(57) ABSTRACT

System and method for providing an electrical fuse having a p-n junction diode. A preferred embodiment comprises a cathode, an anode, and one or more links formed between the cathode and the anode. The cathode and the portion of the cathode adjoining the link are doped with a first impurity, preferably a p-type impurity. The anode and the portion of the link adjoining the anode are doped with a second impurity, preferably an n-type impurity. The junction of the first impurity and the second impurity in the link forms a p-n junction diode. A conductive layer, such as a silicide layer, is formed over the p-n junction diodes. In an alternative embodiment, a plurality of p-n junction diodes may be formed in each link. One or more contacts may be formed to provide electrical contact to the cathode and the anode.

10 Claims, 10 Drawing Sheets

DIODE JUNCTION POLY FUSE

This application is a divisional of patent application Ser. No. 10/806,955, entitled "Diode Junction Poly Fuse," filed on Mar. 23, 2004 now U.S. Pat. No. 6,956,277, which application is incorporated herein by reference.

TECHNICAL FIELD

The present invention relates generally to a system and method for an electrical fuse, and more particularly to a system and method for an electrical fuse for use in semiconductor devices.

BACKGROUND

Fuses are commonly used in integrated circuits to provide redundancy and programming capabilities. To increase yield in integrated circuits such as memory chips, it is common to include redundant memory cells on the memory chips. If a memory circuit is found to be defective or is not needed, the fuse may be blown thereby activating or deactivating the redundant memory cells. Another common practice is to utilize fuses to program or customize integrated circuits for a particular application or customer. In this manner, the same chip may be produced and customized for individual customers by programming the fuses after fabrication, thereby reducing the fabrication costs.

Typically, fuses comprise a conductive link that may be blown or ruptured to prevent current from flowing. In one particular type of fuse, the conductive link is formed of a metal, such as aluminum or copper, and blown by a laser. The use of the laser, however, requires complicated processing steps and expensive laser equipment.

Another type of fuse involves the use of an electrical fuse, which may be blown by passing an electrical current of sufficient magnitude through the selected fuses for a sufficient period of time to alter the electrical properties of the link, generally increasing the resistance of the link. A common design for such a fuse comprises a cathode and an anode interconnected by a thinner fuse link. Such a structure is commonly formed of doped polysilicon or undoped/doped polysilicon having a silicided surface.

To blow the fuse, a sufficiently high current is applied to the link causing high current concentrations or "current crowding" where the dimensions of the fuse are reduced in the link. The current crowding causes silicide agglomeration or melting of the link, increasing the resistance of the link. A sensing circuit is then able to sense the amount of resistance to determine the state of the fuse.

In an attempt to reduce the amount of current and the time period required to blow the fuse, further attempts have incorporated a p-n junction diode in conjunction with the silicided layer. In a typical design, the cathode, anode, and fuse link are formed of a polysilicon material. The cathode of the fuse is doped with p-type impurities, and the fuse link and the anode are doped with n-type impurities. The junction of the p-type cathode and the n-type fuse link forms a p-n junction diode. The surface of the polysilicon at the p-n junction diode is silicided.

To blow the fuse, the cathode is negatively biased and the anode is positively biased causing a reverse bias to be applied to the p-n junction diode. Because the p-n junction diode does not allow the current to flow in this configuration, the current flows through the silicided layer. The current crowding in the silicide layer over the p-n junction causes silicide migration or melting of the link, thereby blowing the fuse. Thereafter, the link is a high-resistance path and allows sensing circuits to detect the blown state of the fuse.

SUMMARY OF THE INVENTION

These and other problems are generally solved or circumvented, and technical advantages are generally achieved, by preferred embodiments of the present invention in which an electrical fuse having a p-n junction diode is provided.

In accordance with a preferred apparatus embodiment of the present invention, an electrical fuse comprises a cathode, an anode, and one or more links electrically coupling the cathode to the anode, wherein each link has a first portion and a second portion. The cathode and the first portion are doped with a first impurity, and the anode and the second portion are doped with a second impurity. Preferably, the first impurity is a p-type impurity, and the second impurity is an n-type impurity. One or more p-n junction diodes are formed in the link at the junctions of portions of the link doped with the first impurity type and portions of the link doped with the second impurity type. A conductive layer, such as a silicide, is formed over the p-n junction diodes. One or more contacts may be formed to provide an electrical connection to the anode and the cathode.

In accordance with a preferred method embodiment of the present invention, a method for forming an electrical fuse is provided. The fuse is formed, preferably from polysilicon, having a cathode, an anode, and one or more links electrically coupling the cathode to the anode, wherein each link has a first portion and a second portion. A first doping process is performed to dope the cathode and the first portion of the links with a first impurity type. A second doping process is performed to dope the anode and the second portion of the links with a second impurity type. One or more p-n junction diodes are formed in the link at the junctions of portions of the link doped with the first impurity type and portions of the link doped with the second impurity type. A conductive layer, such as a silicide, is formed over the p-n junctions, and one or more contacts may be formed to provide an electrical connection to the anode and the cathode.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an electrical fuse having one or more links, each link having one or more p-n junction diodes. The cathode and anode are symmetrical and approximately the same size, and the links are straight. The present invention, however, may also be applied to other fuse structures having varying shapes, sizes, and configurations.

Figure 1A:
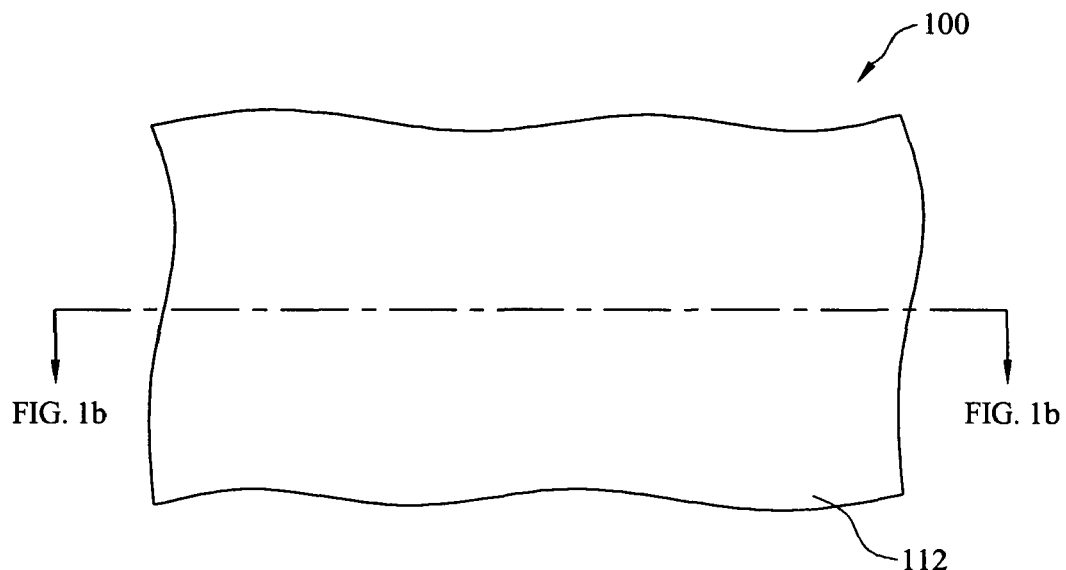
FIGS. 1a-5b are plan views and cross section views after various process steps are performed to fabricate an electrical fuse having a p-n junction diode in accordance with one embodiment of the present invention.

FIGS. 1a-5b illustrate a method for forming a single-link fuse structure in accordance with one embodiment of the present invention. The method begins in FIGS. 1a-1b, wherein FIG. 1a is a plan view of a wafer 100, and FIG. 1b is a cross section view of wafer 100 along the axis indicated in FIG. 1a. Wafer 100 includes a substrate 110 having a polysilicon layer 112 formed thereon. The substrate 110 is preferably a silicon substrate, which is typically undoped, but may be lightly doped. Other materials, such as germanium, quartz, sapphire, and glass could alternatively be used for the substrate 110. In addition, the substrate 110 could be a semiconductor-on-insulator (SOI) wafer. The polysilicon layer 112 is preferably deposited using low-pressure chemical vapor deposition (LPCVD) or CVD techniques to a thickness less than about 2500 Å.

Figure 1B:
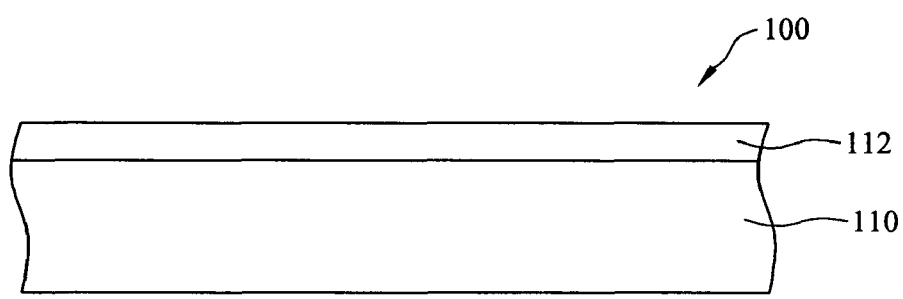
Figure 2A:
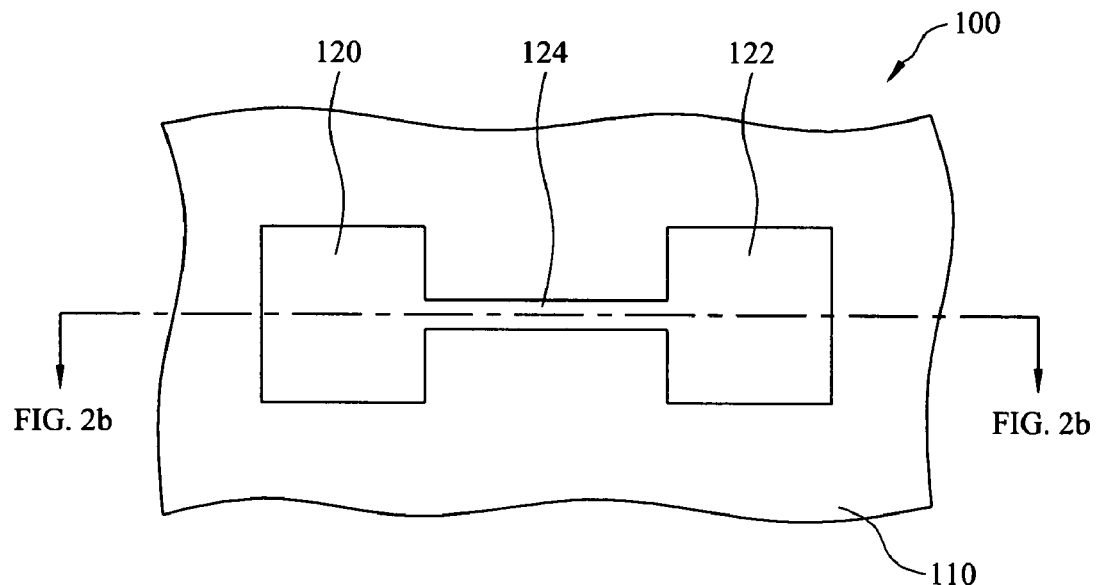
Figure 2B:
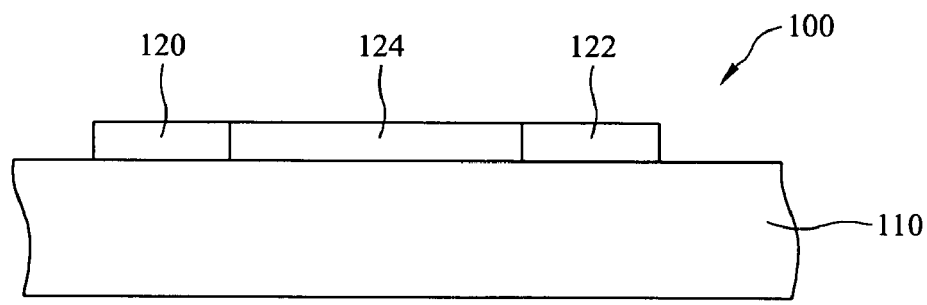

FIGS. 2a and 2b illustrate the wafer 100 of FIGS. 1a-1b after the polysilicon layer 112 (FIG. 1a-1b) has been patterned to form a cathode 120, an anode 122, and a link 124 between the cathode 120 and the anode 122. FIG. 2a is a plan view, and FIG. 2b is a cross section view along the axis indicated in FIG. 2a. The polysilicon layer 112 (FIGS. 1a-1b) may be patterned, for example, by using standard photolithography techniques known in the art. Generally, photolithography techniques involve depositing a photoresist material (not shown), which is masked, exposed, and developed to expose portions of the polysilicon layer 112. The remaining photoresist material protects the underlying material from subsequent processing steps, such as etching. In the preferred embodiment, photoresist material is patterned to define the shape of a fuse as illustrated in FIG. 2a.

After the photoresist material has been applied and patterned, an etching process such as a wet or dry, anisotropic or isotropic etch process, but preferably an anisotropic dry etch process, is performed to form the cathode 120, anode 122, and link 124. Generally, the cathode 120 and the anode 122 are wider areas interconnected with a narrower link 124. Preferably, the cathode 120 and the anode 122 are symmetrical.

The size and the shape of the cathode 120, the anode 122, and the link 124 may also vary. In the preferred embodiment illustrated in FIG. 2a, the cathode 120, the anode 122, and the link 124 are rectangular shaped. In other embodiments, any or all of the cathode 120, the anode 122, and the link 124 may have varying shapes and differing sizes. For example, the link 124 may be jagged, curved, extended, shortened, or the like. Additionally, the cathode 120 and the anode 122 may be oval-shaped, circular, smaller, larger, symmetrical, asymmetrical, differing sizes, or the like.

Figure 3A:
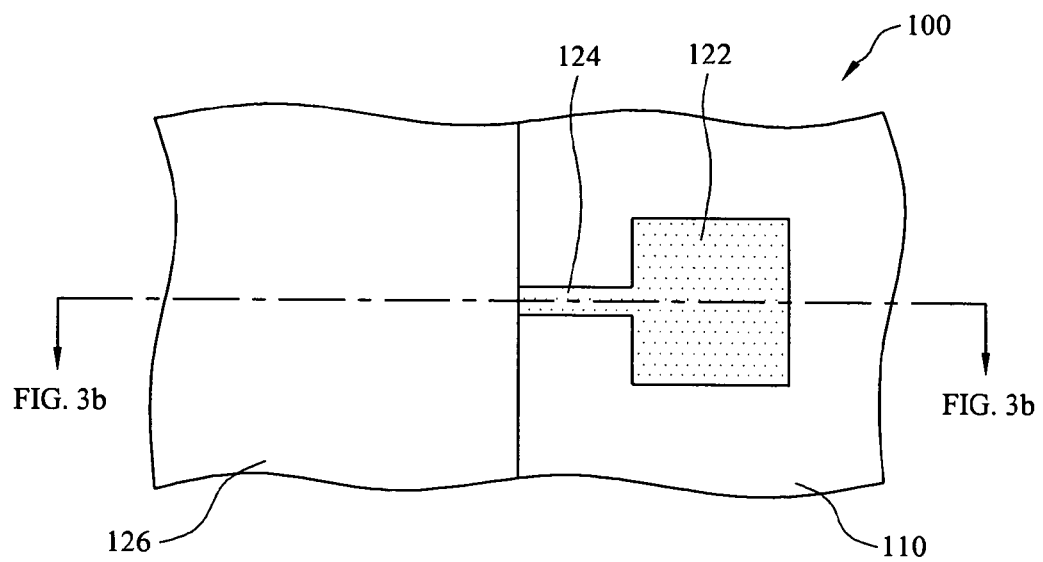
Figure 3B:
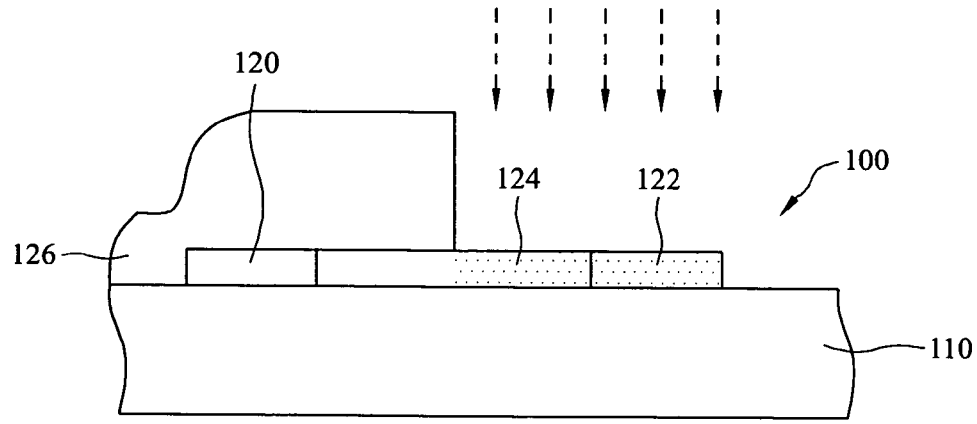

FIGS. 3a-3b illustrate the wafer 100 of FIGS. 2a-2b after the anode 122 and a portion of the link 124 have been doped, wherein FIG. 3a is a plan view and FIG. 3b is a cross section view along the axis indicated in FIG. 3a. The anode 122 is preferably doped with an n-type impurity, such as phosphorous, nitrogen, arsenic, antimony, or the like, at a dose of about 1 E13 to about 5E15 atoms/cm$^2$ and at an energy of about 1 to about 20 KeV. The doping levels may be altered to create an N+ or an N− region as required by the design and particular application.

To prevent doping of the cathode 120 and the remaining portion of the link 124, a first mask 126 is formed over the cathode 120 and a portion of the link 124 to protect those areas from becoming doped. The first mask 126 is preferably a photoresist material or other polymer that is commonly used in the art. The first mask 126 may be removed after performing the n-type doping.

Figure 4A:
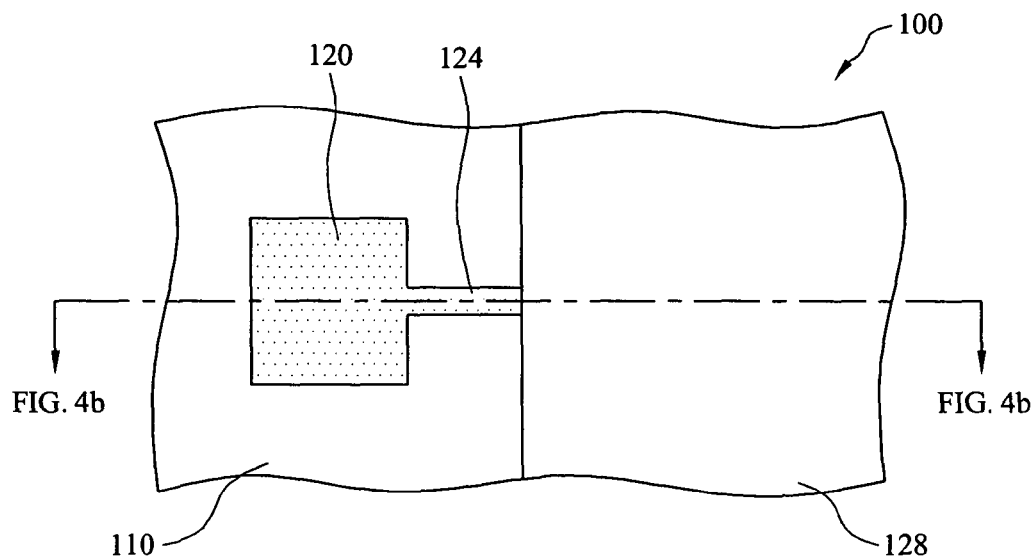
Figure 4B:
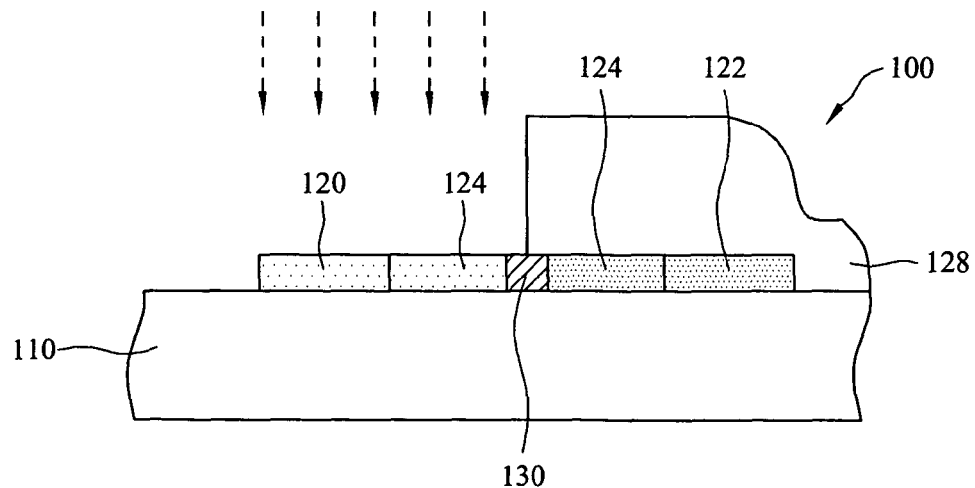

Referring now to FIGS. 4a-4b, the cathode 120 and the remaining portion of the link 124 are doped with a p-type dopant. Similar to the doping of the anode 122 discussed above, a second mask 128, preferably a photoresist material or other polymer, is formed exposing the cathode 120 and the remaining portion of the link 124, and protecting the anode 122 and the portion of the link 124 previously doped with n-type impurities. In the preferred embodiment the cathode 120 and the remaining portion of the link 124 are doped with a p-type impurity, such as boron, aluminum, gallium, indium, BF2 or the like, at a dose of about 1E13 to about 5E15 atoms/cm$^2$ and at an energy of about 1 to about 20 KeV. The doping levels may be altered to create a P+ or a P− region as required by the design and particular application. After doping, the second mask 128 may be removed. It should be noted that a depletion region 130 (FIG. 4b) is formed at the junction of the p-type doped polysilicon and the n-type doped polysilicon.

Figure 5A:
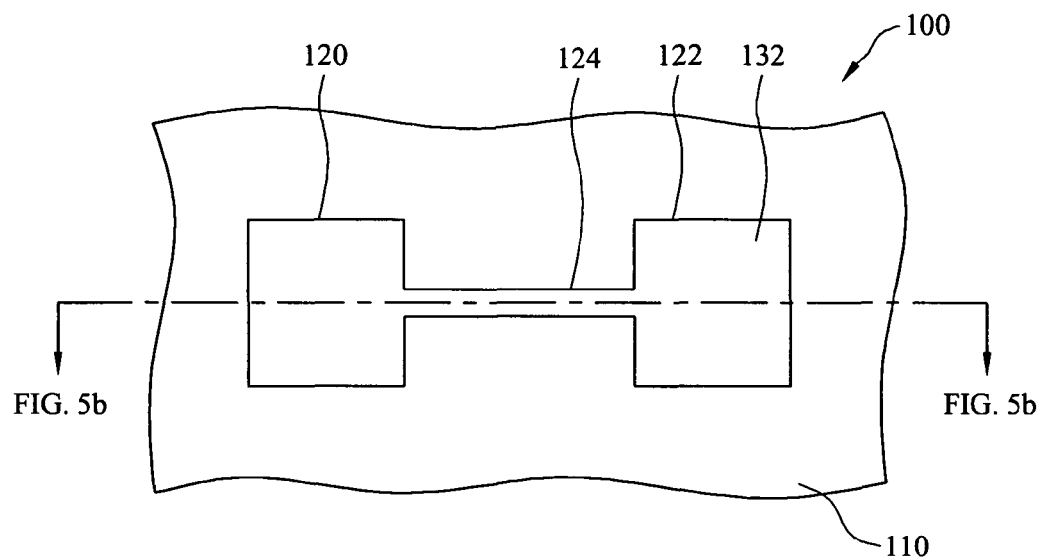
Figure 5B:
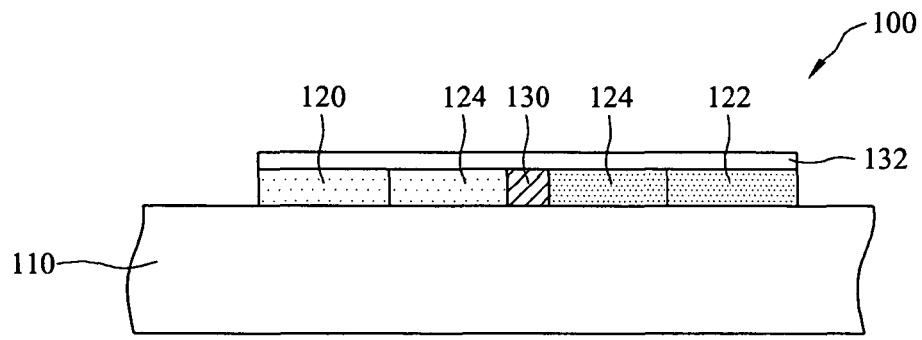

FIGS. 5a-5b illustrate wafer 100 of FIGS. 4a-4b after a silicide layer 132 has been formed on the surface of the cathode 120, the anode 122, and the link 124. FIG. 5a is a plan view, and FIG. 5b is a cross section view along the axis illustrated in FIG. 5a. Preferably, the silicide layer 132 is formed by depositing a metal layer and performing an anneal. Metals that may be used include titanium, cobalt, nickel, and platinum, forming a silicide layer 132 comprising titanium silicide, cobalt silicide, nickel silicide, or platinum silicide, respectively. Other materials may be used. In the preferred embodiment, the silicide layer covers the entire surface of the electrical fuse as illustrated in FIGS. 5a-5b.

Figure 6:
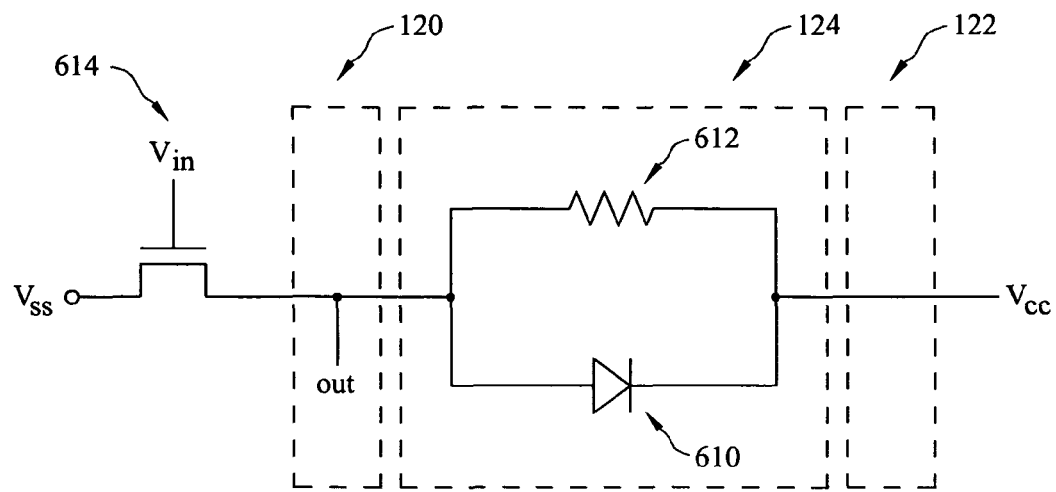
FIG. 6 is a schematic of an electrical circuit corresponding to a fuse fabricated in accordance with FIGS. 1a-5b prior to programming.

A schematic equivalent to the fuse, prior to programming, formed by the process discussed above is shown in FIG. 6. The link 124 is represented by a p-n junction diode 610 and a resistor 612. The p-n junction diode 610 is the p-n junction formed in the doped polysilicon, and the resistor 612 is the silicide layer on the surface of the polysilicon. Assuming the convention that current flows from positive to negative, the p-n junction diode 610 normally allows current to flow from the cathode 120 (p-type doped) to the anode 122 (n-type doped). A programming transistor 614 allows the transistor to be programmed (e.g., blown).

Figure 7:
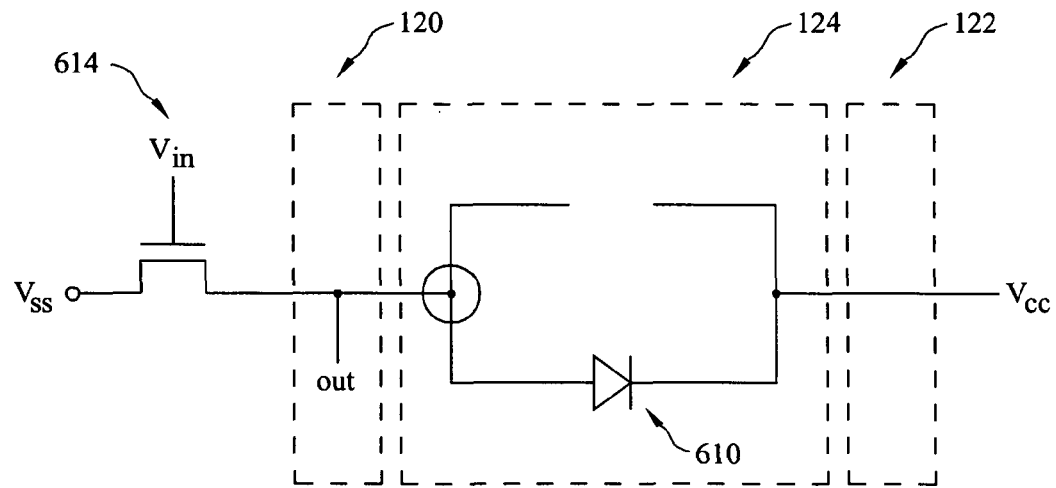
FIG. 7 is a schematic of an electrical circuit corresponding to a fuse fabricated in accordance with FIGS. 1a-5b after programming.

To blow the fuse, a reverse bias is applied to the p-n junction diode 610. Because the p-n junction diode 610 restricts current from flowing through the polysilicon, the current is restricted to flowing through the resistor 612, i.e., the silicide layer 132 of FIG. 5b. Current crowding in the resistor causes silicide depletion to occur in the silicide layer 132, thereby blowing the fuse or causing the fuse to go to a high-resistance state. FIG. 7 illustrates the schematic diagram of FIG. 6 after the fuse has been blown.

Figure 8:
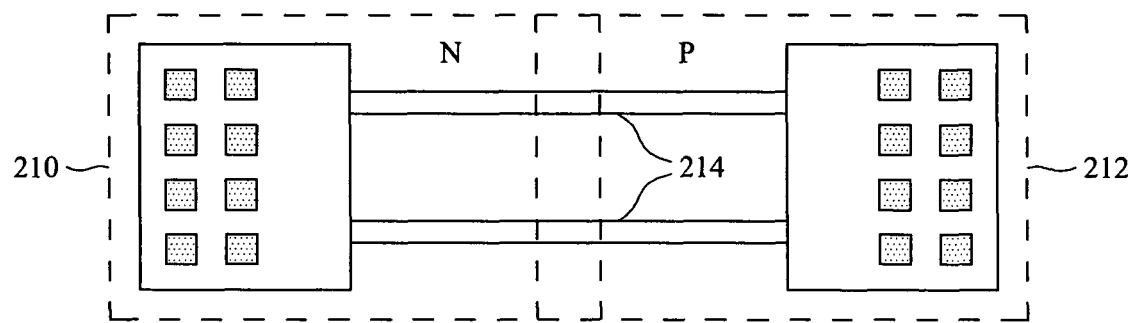
FIG. 8 is a plan view of an electrical fuse having a plurality of links, each link having a p-n junction diode, in accordance with one embodiment of the present invention.
Figure 9:
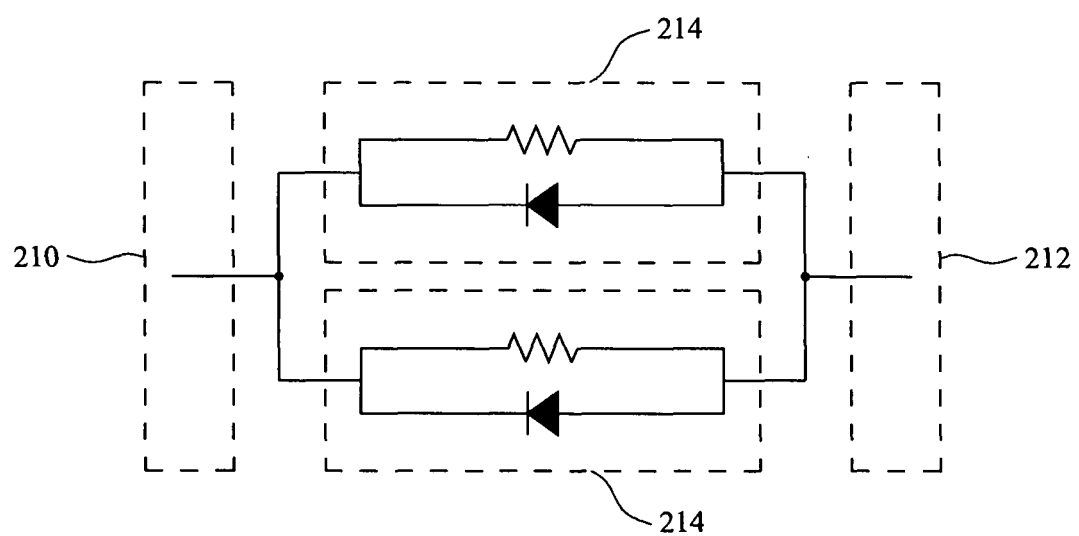
FIG. 9 is a schematic corresponding to the electrical fuse of FIG. 8 in accordance with one embodiment of the present invention.

FIG. 8 is a plan view of an electrical fuse having a plurality of links 214, each link having a p-n junction diode, in accordance with another embodiment of the present invention. FIG. 9 is a schematic corresponding to the electrical fuse of FIG. 8. As illustrated in FIG. 8, the plurality of links 214 are formed between a cathode 210 and an anode 212. The multi-link electrical fuse of FIG. 8 may be fabricated using the process steps discussed above with reference to FIGS. 1a-5b.

The plurality of links 214 provide redundant links in the event one or more links are faulty due to process variations. For example, variations in the silicide process may cause the silicide layer on the links to be incomplete, possibly creating a high resistance. In this situation, some of the links may appear to be blown prior to programming. By having multiple links 214, one or more faulty links will not cause the fuse to appear blown if there are good links remaining.

Programming of the multi-link electrical fuse may be performed in the same manner as the single-link electrical fuse. After programming, the silicide layers over the p-n junctions are depleted, thereby creating a high resistance between the cathode 210 and anode 212.

Figure 10:
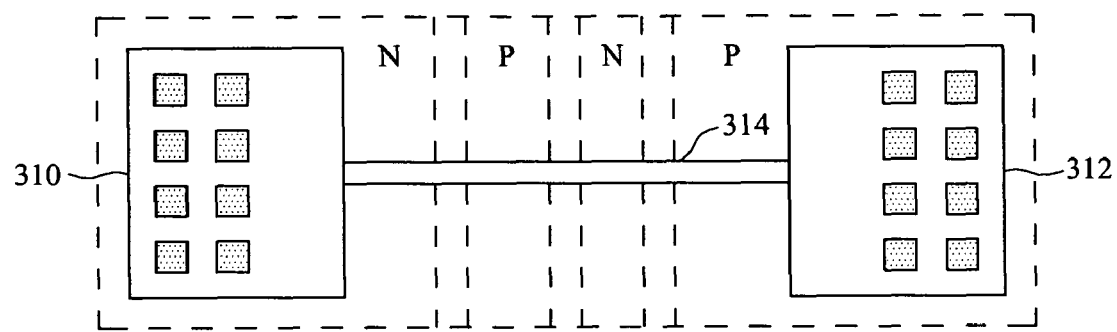
FIG. 10 is a plan view of an electrical fuse with a single link having a plurality of p-n junction diodes in accordance with one embodiment of the present invention.
Figure 11:
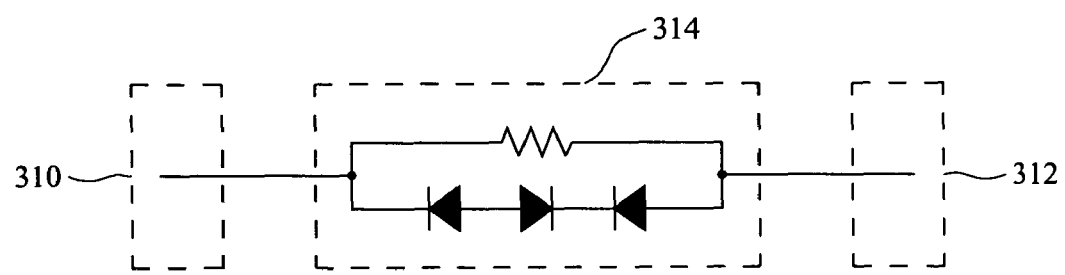
FIG. 11 is a schematic corresponding to the electrical fuse of FIG. 10 in accordance with one embodiment of the present invention.

In yet another embodiment illustrated in FIG. 10, an electrical fuse having a link 314 with a plurality of p-n junction diodes is provided. FIG. 11 is a schematic corresponding to the electrical fuse illustrated in FIG. 10. In this situation, the link 314 is formed between a cathode 310 and an anode 312 similar to the embodiment discussed above, but multiple p-n junctions are formed in the link 314. Multiple p-n junction diodes enhance the programming efficiency.

Figure 12:
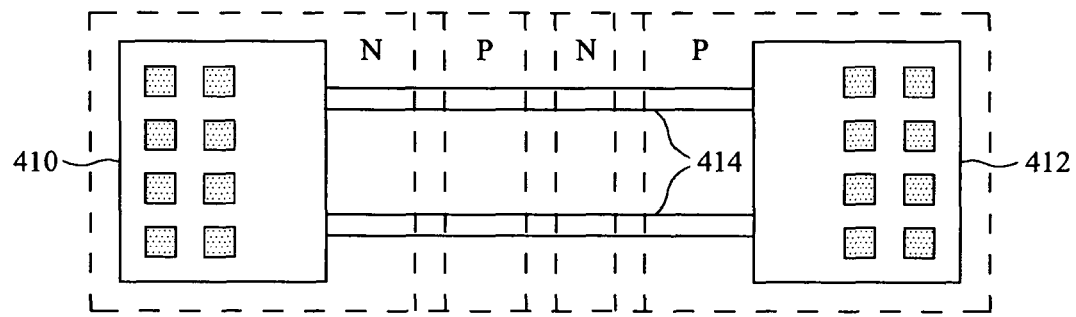
FIG. 12 is a plan view of an electrical fuse having a plurality of links, each link having a plurality of p-n junction diodes, in accordance with one embodiment of the present invention.
Figure 13:
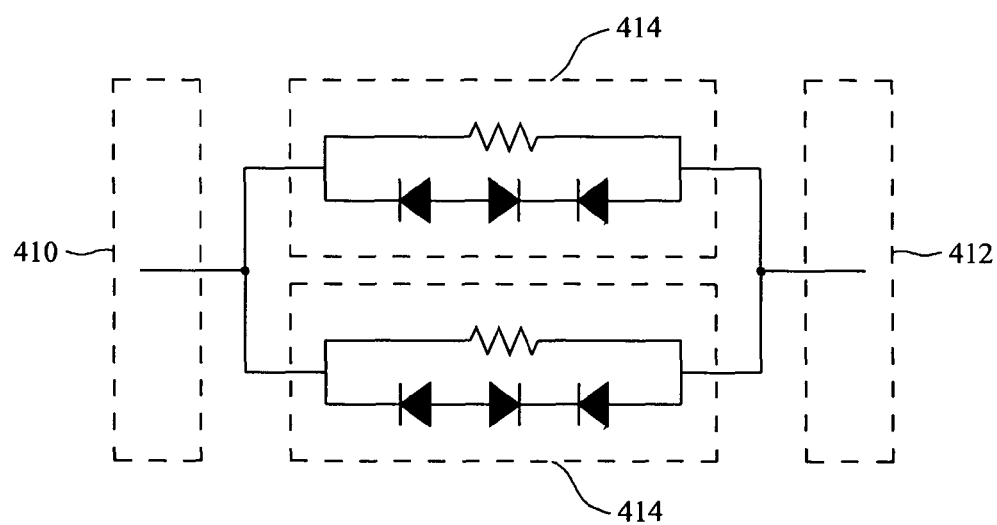
FIG. 13 is a schematic corresponding to the electrical fuse of FIG. 12 in accordance with one embodiment of the present invention.

Yet another embodiment is illustrated in FIGS. 12 and 13, wherein an electrical fuse having a plurality of links 414 between a cathode 410 and an anode 412 is provided, wherein each link has a plurality of p-n junction diodes. This embodiment combines the advantages of the multi-link embodiment and the multiple p-n junction diode embodiment. Accordingly, this embodiment provides for link redundancy by having a plurality of links and increased programming efficiency from forming multiple p-n junction diodes on each link.

Figure 14:
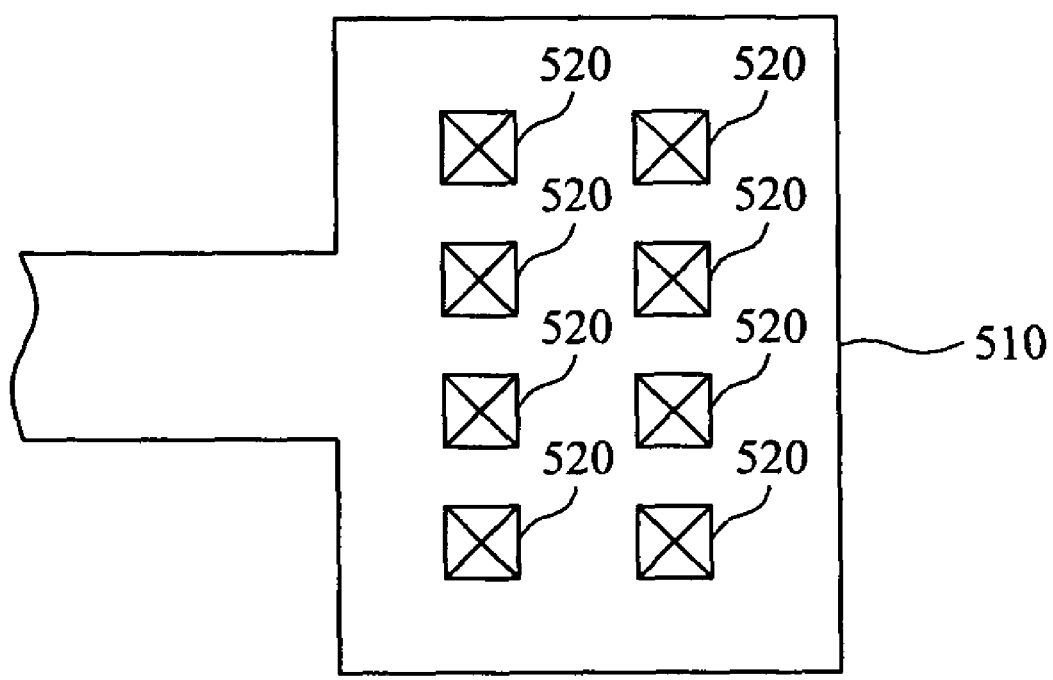
FIG. 14 is a plan view of a cathode/anode showing an array of contacts in accordance with one embodiment of the present invention.

FIG. 14 is a plan view of an anode/cathode 510 illustrating a contact layout in accordance with one embodiment of the present invention. Generally, contacts 520 are formed in an interlayer dielectric (not shown) to provide an electrical connection between the anode/cathode 510 and a metal layer (not shown). Preferably, the anode/cathode 510 has a plurality of contacts 520, such as the contact array illustrated in FIG. 14 to reduce the contribution of contact Rc to the total resistance of the fuse link.

Although the present invention and its advantages have been described in detail, it should be understood that various changes, substitutions, and alterations can be made herein without departing from the spirit and scope of the invention as defined by the appended claims. For example, the materials and processes used to form the electrical fuses disclosed herein may be altered, as well as the shapes and configurations.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an electrical fuse, the method comprising:
    forming a cathode, an anode, and a plurality of links, each link interconnecting the cathode and the anode on a substrate;
    doping the anode and at least a portion of at least one of the plurality of links with a first impurity;
    doping the cathode and at least a portion of at least one of the plurality of links with a second impurity such that a plurality of junctions between the first impurity and the second impurity are formed in at least one of the plurality of links; and
    forming a conductive layer over the plurality of junctions.

2. The method of claim 1, wherein the first impurity is a p-type impurity and the second impurity is an n-type impurity.

3. The method of claim 1, wherein the conductive layer is a silicide.

4. The method of claim 1, wherein the conductive layer is less than 500 Å in thickness.

5. The method of claim 1, wherein the conductive layer is a material selected from the group consisting essentially of titanium silicide, cobalt silicide, nickel silicide, platinum silicide, and a combination thereof.

6. The method of claim 1, wherein the cathode, the anode, and the plurality of links comprise polysilicon.

7. The method of claim 1, wherein the cathode, the anode, and the plurality of links are less than 2500 Å in thickness.

8. The method of claim 1, further comprising one or more contacts electrically coupled to the cathode and one or more contacts electrically coupled to the anode.

9. The method of claim 1, further comprising a first contact array comprising a plurality of contacts electrically coupled to the cathode, and further comprising a second contact array comprising a plurality of contacts electrically coupled to the anode.

10. The method of claim 1, wherein the cathode and the anode are symmetric.

* * * * *